United States Patent [19]

Wozniczka

[11] Patent Number: 4,695,924
[45] Date of Patent: Sep. 22, 1987

[54] TWO PIECE HEAT SINK WITH SERRATED COUPLING

[75] Inventor: George Wozniczka, Chicago, Ill.

[73] Assignee: Zenith Electronics Corporation, Glenview, Ill.

[21] Appl. No.: 887,147

[22] Filed: Jul. 17, 1986

[51] Int. Cl.[4] .............................................. H05K 7/20
[52] U.S. Cl. .................................. 361/386; 361/381; 200/289; 174/16 HS
[58] Field of Search ............... 361/386, 384, 383, 832, 361/381; 200/289; 174/16 HS, 16 R

[56] References Cited

U.S. PATENT DOCUMENTS

| | | | |
|---|---|---|---|
| 2,883,591 | 4/1959 | Camp | 361/385 |
| 3,312,277 | 4/1967 | Chitouras et al. | 361/386 |
| 4,449,164 | 5/1984 | Carlson et al. | 361/384 |
| 4,546,405 | 10/1985 | Hultmark et al. | 361/386 |
| 4,594,643 | 6/1986 | Hermann | 361/386 |
| 4,621,304 | 11/1986 | Oogaki et al. | 361/386 |

OTHER PUBLICATIONS

Page 84 of brochure of AAVID Engineering, Inc., entitled "Extrusions".

Primary Examiner—Robert S. Macon

[57] ABSTRACT

A two piece heat sink includes a first elongated mount-/support member adapted at a first end for secure mounting on a printed circuit (PC) board and a second finned convector member adapted for secure, intimate coupling to a second end of the first mount/support member. The second convector member has a serrated aperture, or channel, therein and a plurality of fins disposed about its lateral periphery and aligned along the longitudinal axis of the first mount/support member so as to be oriented generally perpendicular to the plane of the PC board. The mount/support member is tapered along its length and its second end is beveled to facilitate its insertion within the second member's aperture to permit the mount/support member to be press fit coupled to the convector member. Press fitting the two heat sink members together causes the serrations within the convector member's aperture to cold flow resulting in intimate and secure coupling between the two heat sink members providing a high degree of mechanical coupling and thermal transfer therebetween. The vertically oriented fins are aligned with the upward flow of air heated by the circuitry on the PC board for efficient thermal dissipation, while the mount/support member provides a mounting surface for an electronic component and allows for minimum PC board mounting area for the heat sink.

10 Claims, 6 Drawing Figures

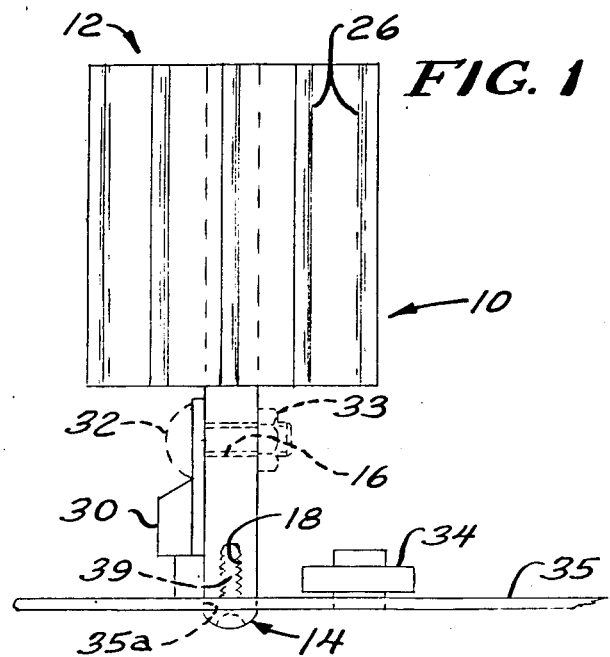
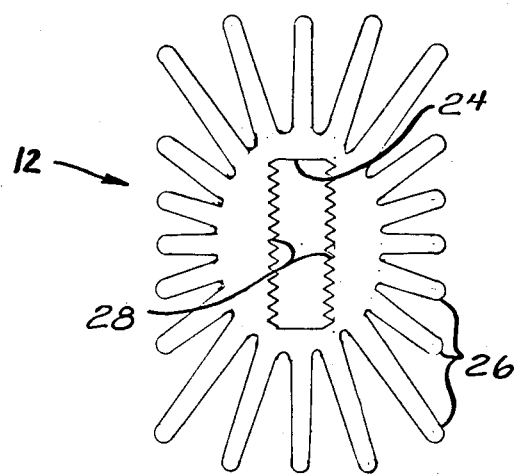
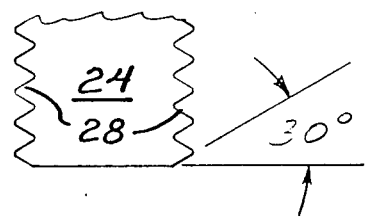
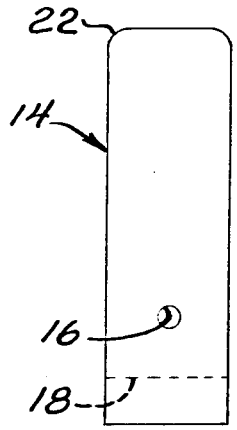
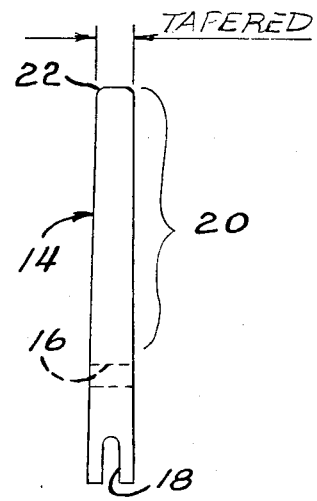
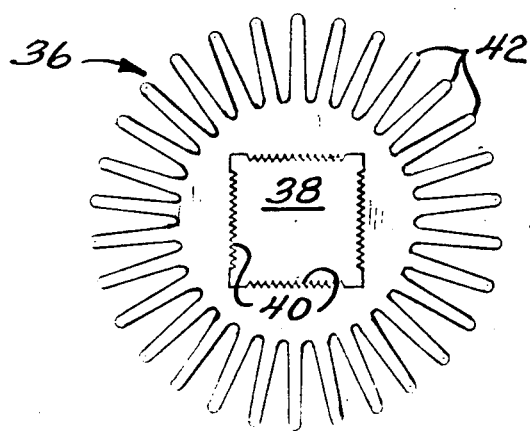

TWO PIECE HEAT SINK WITH SERRATED COUPLING

BACKGROUND OF THE INVENTION

This invention relates generally to heat sinks for use on a printed circuit (PC) board and is particularly directed to a two piece heat sink which provides a large surface area per unit volume and thus efficient heat tranfer/dissipation and requires minimal PC board surface for mounting.

Heat sinks are typically comprised of a metal having a high thermal conductivity and are mounted upon a PC board for limiting the operating temperature of electronic components positioned in circuit upon the board. Ideally, the heat sink should occupy a minimum area on the PC board to permit high density electronic component packaging. The heat sink should also provide a high degree of heat transfer and thermal dissipation to accommodate the increased density of the electronic circuitry associated therewith. Increasing the thermal dissipation by means of convection generally requires increasing the surface area per unit volume of the heat sink.

In the past, attempts to increase the heat sink surface area per unit volume have resulted in corresponding increases in the area upon the PC board occupied by the heat sink. Approaches to minimizing PC board mounting area while increasing heat sink surface area have generally resulted in finned structures wherein a plurality of planar fins are oriented generally parallel to the surface of the PC board. This fin orientation provides only limited thermal dissipation by convection since the heated air rises generally perpendicular to the surface of the PC board and only the outer edges of the fins are exposed to the upward air flow producing only limited convection cooling. Attempts to orient the fins generally perpendicular to the surface of the PC board and thus increase the air flow over the fins have resulted in heat sink arrangements which require considerable PC board mounting area or which involve the coupling of various heat sink components in forming the heat sink structure. The manner in which these heat sink components are coupled typically involves the use of screws or nut/bolt combinations or the soldering of adjoining heat sink components. In either case, heat transfer between abutting heat sink components is limited by such coupling arrangements and thermal dissipation is correspondingly inhibited.

The present invention overcomes the aforementioned limitations of the prior art by providing a two piece heat sink assembly which requires minimal PC board mounting area, affords a high degree of heat transfer between the two heat sink components, provides a finned structure offering maximum heat sink surface area per unit volume, and includes fins oriented along the direction of heated air flow.

OBJECT OF THE INVENTION

Accordingly, it is an object of the present invention to provide a high degree of themal dissipation in a PC board with a heat sink which occupies a minimal PC board surface area.

It is another object of the present invention to provide a low cost, efficient, and easily fabricated and installed heat sink for use on a PC board.

Still another object of the present invention is to provide a two piece heat sink which offers a large surface area per unit volume; directs thermal energy away from a PC board upon which it may be easily, securely and intimately mounted; requires a minimim PC board mounting area; and is adapted to receive an electronic component mounted directly thereon.

A further object of the present invention is to provide improved thermal conduction in a heat sink assembly using cold flow techniques by press fitting heat sink components together.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is a lateral view shown partially in phantom of a two piece heat sink with serrated coupling mounted upon a PC board in accordance with the present invention;

FIG. 2 is a top plan view of a finned thermal convector member for use in the two piece heat sink of FIG. 1;

FIG. 3 is an enlarged plan view of a portion of the serrated aperture in the finned thermal convector member shown in FIG. 2;

FIGS. 4 and 5 are respectively front and lateral plan views of a mounting/support member for use in the two piece heat sink of the present invention; and FIG. 6 illustrates another embodiment of a thermal convector member for use in the two piece heat sink of the present invention wherein the finned convective member is generally cylindrical in shape and includes a generally square serrated aperture therein.

DETAILED DESCRIPTION OF THE PREFERRED EMBODIMENTS

Referring to FIG. 1, there is shown a lateral view of a two-piece heat sink 10 in accordance with the present invention mounted on a PC board 35. The two-piece heat sink 10 includes an upper convector 12 and a lower mount/support 14. Top plan views of two variations of an upper convector for use in the two-piece heat sink of the present invention are shown in FIGS. 2 and 6. FIGS. 4 and 5 respectively illustrate front and lateral views of the lower mount/support 14 used in one embodiment of the two-piece heat sink of the present invention. FIG. 3 illustrates details of a serrated aperture 24 located in the upper convector 12 of the two-piece heat sink. Details of the present invention illustrated in the aforementioned figures are discussed in the following paragraphs.

The lower mount/support 14 in a preferred embodiment is generally rectangular in cross section and includes first and second end portions. The first end portion includes a slot 18 and is adapted for insertion in an aperture 35a within a PC board 35 upon which the heat sink 10 is to be mounted. The slot 18 is adapted to receive one or more threaded coupling pins such as screws 39, which may be of the self-tapping type, for securing the first end of the lower mount/support 14 to the PC board 5. The PC board 35 typically has positioned thereon various electronic or electrical circuit components on one or both sides thereof. For simplicity, a single electronic component 34 is shown positioned on the upper surface of the PC board 35.

The lower mount/support 14 further includes an aperture or channel 16 extending therethrough which is also typically adapted to receive a threaded coupling pin such as a screw or a bolt 32. As shown in dotted line form in FIG. 1, a bolt 32 is inserted within aperture 16 and is maintained in position on the lower mount/support 14 by means of a nut 33. By means of the nut and bolt combination 33, 32, another electronic component 30, which may also be coupled to circuitry on the PC board 35, may be maintained in position upon the lower mount/support 14 of the two-piece heat sink 10. The heat sink 10 serves to stabilize the operating temperature of the electronic components 30 and 34 by absorbing heat either directly or indirectly via the PC board 35 from these electronic components and transmitting the heat away from the electronic components to its upper convector 12 and thence to the surrounding environment. The heat generated by operation of the electronic components on the PC board 35 causes the surrounding air to be heated and to flow upward, away from the PC board. The heated air thus flows upward along the length of the heat sink 10 as shown in FIG. 1. Although the temperature of this air has been elevated somewhat above room temperature due to the operation of the circuit on the PC board 35, it is still much lower in temperature than the electronic components on the PC board and the heat sink itself. Thus, the temperature of the two-piece heat sink 10 is lowered by convection as the cooler air is circulated over its surface.

The upper convector 12 includes an aperture defined by a plurality of serrations 28 on one or more inner surfaces of the upper convector. Although the aperture 24 within the upper convector 12 in FIG. 2 is shown as generally rectangular in cross section and the aperture 38 within the upper convector 36 in FIG. 6 is illustrated as generally square in cross section, the present invention is not limited to these or any other particular shape aperture within the upper convector. The essential feature of the aperture within the upper convector is not its shape, but rather that it is defined by a plurality of serrations on one or more inner surfaces of the upper convector. These serrations are illustrated as elements 28 in FIGS. 2 and 3 and as elements 40 in FIG. 6. The teeth-like serrations extend outward from the body of the upper convector and into its aperture so as to provide the aperture with a large number of protrusions.

With the lower mount/support 14 provided with a tapered section 20 as well as a beveled second end 22, the lower mount/support is adapted for insertion within the aperture 24 of the upper convector 12. With the beveled second end 22 of the lower mount/support 14 positioned within the upper convector's aperture 24, further displacement of the lower mount/support within the convector 12 is opposed by engagement of the lateral walls of the lower mount/support with the inner surfaces of the upper convector defining its aperture. By forcing the lower mount/support 14 further into the upper convector's aperture 28 by conventional mechanical means, which for simplicity is not shown in the figures, the serrations 28 within the aperture may be caused to cold flow against the lateral surfaces of the lower mount/support. Cold flowing of the serrations 28 not only increases the area of contact between the lower mount/support 14 and the upper convector 12, but also forces the lower mount/support into the upper convector's aperture 24 in a wedge-like manner providing a secure, fixed coupling between these two heat sink components. The increased area of intimate contact between the upper convector 12 and lower mount/support 14 provides efficient heat transfer between these two heat sink components and facilitates the transfer of heat removed from the PC board 35 by the lower mount/support to the upper convector and its removal therefrom by convection.

As shown in FIG. 3, the serrations in a preferred embodiment are inclined at 30° relative to a line drawn perpendicular to the inner wall of the upper convector forming a portion of the aperture therein. Although not shown in the figures, the serrated aperture within the heat sink's upper convector 14 may be defined by curvilinear walls and, in fact, may be generally circular in cross section. The primary requirement for the aperture 24 within the upper convector 12 is that it be provided around at least a portion of its periphery with a plurality of serrations and that it be sized so as to securely and intimately engage the lower mount/support 14 inserted therein when press fit together. Virtually any press-like force applying mechanism may be used to displace the upper convector 12 and the lower mount/support 14 toward each other and in press fitting engagement with the lower mount/support inserted within the upper convector's aperture 24 provided that the mechanism is capable of applying a press fit force in excess of that required to deform the serrations of the upper convector. For a typical material used in fabricating the heat sink 12, such as aluminum alloy, this force is on the order of 12,000 PSI to induce cold flow. The tapered portion 20 of the lower mount/support 14 ensures that further displacement of the lower mount/support through the upper convector's aperture 28 will provide increasingly tight fitting engagement and coupling between the upper convector and the lower mount/support. The higher the degree of engagement and the greater the extent of contact between the upper convector 12 and lower mount/support 14, the greater and more efficient will be the heat transfer between these two heat sink components.

The upper convector 12 shown in FIG. 2 is generally of the "star burst" pattern type, while the upper convector 36 illustrated in FIG. 6 is generally cylindrical in shape, having generally flat upper and lower surfaces. In both upper convectors, however, the fins 26 and 42 are aligned generally along the length of the lower mount/support to which the upper convector is mounted and generally perpendicular to the plane of the PC board upon which the heat sink is positioned. By orienting the fins along the direction of air flow adjacent to the PC board, greater heat may be removed from the heat sink by convection permitting the circuitry positioned on the PC board to be operated at a lower temperature.

There has thus been shown a two-piece heat sink which includes a lower, PC board attached mount/support member and an upper, finned convector. The lower mount/support is provided with a small cross section to minimize PC board space required for mounting the heat sink, while the upper convector is provided with a large number of spaced fins oriented generally along the direction of air flow adjacent to the PC board for improved heat dissipation by means of convection. The two heat sink components are attached by press fit employing a serrated aperture.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and cope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. For mounting on a printed circuit (PC) board, a heat sink comprising:
    a generally linear, elongated first member having a longitudinal axis and first and second end portions and comprised of a high thermal conductivity material, wherein said first member is tapered in proceeding from the first to the second end portion thereof and the first end portion thereof includes mounting means for securely mounting said first member to a printed circuit board; and
    a second member comprised of a high thermal conductivity material and including a plurality of spaced, generally planar fins disposed on the periphery thereof and aligned along the longitudinal axis of said first member, said second member having an aperture therein adapted to receive the second end of said first member in tight fitting relation, wherein said aperture is defined around the periphery thereof by a plurality of serrations which are adapted for deformation upon contact with said first member when the second end of said first member is inserted under pressure into the aperture of said second member, whereupon intimate engagement and high thermal conductivity is established between said first and second members.

2. The heat sink of claim 1 wherein the second end portion of said first member includes a beveled edge to facilitate insertion of said first member into the aperture of said second member.

3. The heat sink of claim 1 wherein said fins extend generally radially outward from the center of said second member.

4. The heat sink of claim 3 wherein said second member has a generally circular cross section perpendicular to the longitudinal axis of said first member with said fins extending outwardly in a spoke-like manner from the center of said second member.

5. The heat sink of claim 1 wherein said first and second members are comprised of an extruded metal.

6. The heat sink of claim 1 wherein said first member includes attachment means for positioning an electronic component thereon.

7. The heat sink of claim 6 wherein said attachment means includes an aperture in said first member and a threaded coupling pin adapted for insertion in and secure engagement within said aperture.

8. The heat sink of claim 1 wherein said mounting means on said first member includes an aperture in the first end portion thereof and a threaded mounting pin adapted for insertion in said aperture and secure engagement with said first member in securely mounting said heat sink on the PC board.

9. The heat sink of claim 1 wherein said first member is generally rectangular in cross-section and the aperture in said second member is defined by four serrated inner walls of said second member.

10. The heat sink of claim 1 wherein said first member and the fins of said second member are oriented generally perpendicular to the plane of the PC board.

* * * * *